US008215498B2

(12) United States Patent
Rathbone et al.

(10) Patent No.: US 8,215,498 B2
(45) Date of Patent: Jul. 10, 2012

(54) MODULAR RACK SYSTEM

(75) Inventors: Jason Rathbone, Amesbury, MA (US);
Michael Rotelli, Pepperell, MA (US);
David Tolmie, Waltham, MA (US)

(73) Assignee: Raytheon Company, Waltham, MA (US)

( * ) Notice: Subject to any disclaimer, the term of this patent is extended or adjusted under 35 U.S.C. 154(b) by 659 days.

(21) Appl. No.: 12/150,770

(22) Filed: Apr. 30, 2008

(65) Prior Publication Data
US 2009/0321371 A1 Dec. 31, 2009

(51) Int. Cl.
*A47F 7/00* (2006.01)
(52) U.S. Cl. ............... 211/26.2; 248/49; 361/826
(58) Field of Classification Search ............ 211/26.2, 211/13.1; 248/49; 361/825–829; 379/326–329; 439/526, 712, 715–719; 312/223.6
See application file for complete search history.

(56) References Cited

U.S. PATENT DOCUMENTS

| 2,191,637 | A | * | 2/1940 | Wier ............................. 361/829 |
| 2,467,828 | A | * | 4/1949 | Hodgkins et al. ............ 361/828 |
| 2,959,715 | A | * | 11/1960 | Leonchick .................... 361/829 |
| 4,553,674 | A | * | 11/1985 | Yoshikawa et al. ............ 211/26 |
| D388,400 | S | * | 12/1997 | Rogers ......................... D13/199 |
| 5,715,348 | A | * | 2/1998 | Falkenberg et al. .......... 385/135 |
| 5,758,002 | A | * | 5/1998 | Walters ........................ 385/134 |
| 5,902,961 | A | * | 5/1999 | Viklund et al. .............. 174/100 |
| 6,129,316 | A | * | 10/2000 | Bauer .......................... 248/68.1 |
| 6,394,398 | B1 | * | 5/2002 | Reed et al. ..................... 248/57 |
| 6,516,954 | B2 | * | 2/2003 | Broome ........................ 211/26 |
| 6,541,705 | B1 | * | 4/2003 | McGrath .................... 174/99 R |
| 6,708,830 | B2 | * | 3/2004 | Mendoza ....................... 211/26 |
| 7,229,050 | B2 | * | 6/2007 | Schloss ........................... 248/49 |

* cited by examiner

*Primary Examiner* — Korie H. Chan
(74) *Attorney, Agent, or Firm* — Thorpe North & Western LLP

(57) ABSTRACT

The subject invention features, in one example, a modular rack system including a plurality of legs each including an integral cable raceway and arranged to define electronic equipment bays between spaced legs, equipment mounting rails for the bays; and a cable management tray extending across the top of each bay.

21 Claims, 13 Drawing Sheets

MODULAR RACK SYSTEM

GOVERNMENT RIGHTS

This invention was made with U.S. Government support under Contract No. W31P4Q-04-C-0020 by the U.S. Army. The Government has certain rights in the subject invention.

FIELD OF THE INVENTION

This subject invention relates to an equipment rack.

BACKGROUND OF THE INVENTION

Various equipment rack configurations are known and, typically, cable management of the electronic equipment housed in the bays of the equipment rack is an afterthought. It is common, for example, to attach an outwardly facing cable raceway between adjacent bays.

In a height reducible electronics enclosure designed to be carried by a vehicle and extend to a height of 85 inches when deployed and collapse to a height of 45 inches for transport, space is extremely limited. There maybe several personnel workstations and the need for multiple different types of electronic equipment with many feet of cabling.

Design constraints for equipment racks in such an enclosure include a maximum height of 45 inches. Also, since the enclosure is transported and since military personnel regularly maneuver within the enclosure, the electronic equipment and all the cabling associated with the electronic equipment must be secure. Furthermore, a given enclosure might serve different missions. Therefore, the equipment racks must be modular in design and reconfigurable to support various mission requirements.

Currently available equipment racks fail to meet these design requirements.

BRIEF SUMMARY OF THE INVENTION

It is therefore an object of this invention to provide a new equipment rack.

It is a further object of this invention to provide such an equipment rack which is rugged and protects both the equipment mounted in the bays of the rack and also the equipment cabling.

It is a further object of this invention to provide such an equipment rack which is modular and reconfigurable.

It is a further object of this invention to provide such an equipment rack which provides easy access to cabling and easier routing of the cabling.

It is a further object of this invention to provide such an equipment rack which, in one example, fits within a height reducible electronics enclosure in its collapsed configuration.

It is a further object of this invention to provide such an equipment rack which maximizes the space available for electronic equipment.

It is a further object of this invention to provide such an equipment rack which includes integrated storage features and a useful table top work surface.

It is a further object of this invention to provide such an equipment rack which meets typical tactical shock and vibration requirements.

The subject invention results from the realization, in part, that a modular rack system with increased functionality and an increased capacity is affected by structural elements that perform multiple functions. For example, the legs of the rack preferably serve both as supporting members defining the bays of the rack and as cable raceways. In another example, the top of the rack serves as a structural element, as a cable management tray, functions to serve as a storage location, and serves as a work table top surface.

The subject invention features, in one example, a modular rack system including a plurality of legs each including an integral cable raceway and arranged to define electronic equipment bays between spaced legs, equipment mounting rails for the bays; and a cable management tray extending across the top of each bay.

In the preferred embodiment, each leg includes spaced sidewalls each including spaced outward castellations for access to the cable raceway between the spaced sidewalls. Further included is an inward wall joining the spaced sidewalls. The inward wall may include spaced orifices for access to the cable raceway between the spaced sidewalls. Further included are spaced end caps bridging the castellations.

There may be a bracket between adjacent legs in each bay, a cover for each cable management tray, a door in each cover defining a storage space in each tray, and a bracket for power and data ports in each storage space.

Also included may be a plurality of brackets for fastening a leg to a structure and a removable orifice plate between adjacent brackets.

A typical modular rack system bay is defined by four legs. Each leg includes an integral cable raceway and an equipment mounting rail. A cable management tray extends across the top of the bay.

In one example, a modular rack system in accordance with the subject invention includes a plurality of legs arranged to define electronic equipment bays between spaced legs. Each leg includes spaced sidewalls defining a cable raceway, each side wall having spaced outward castellations for access to the cable raceway. A cable management tray extends across the top of each bay.

The subject invention, however, in other embodiments, need not achieve all these objectives and the claims hereof should not be limited to structures or methods capable of achieving these objectives.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
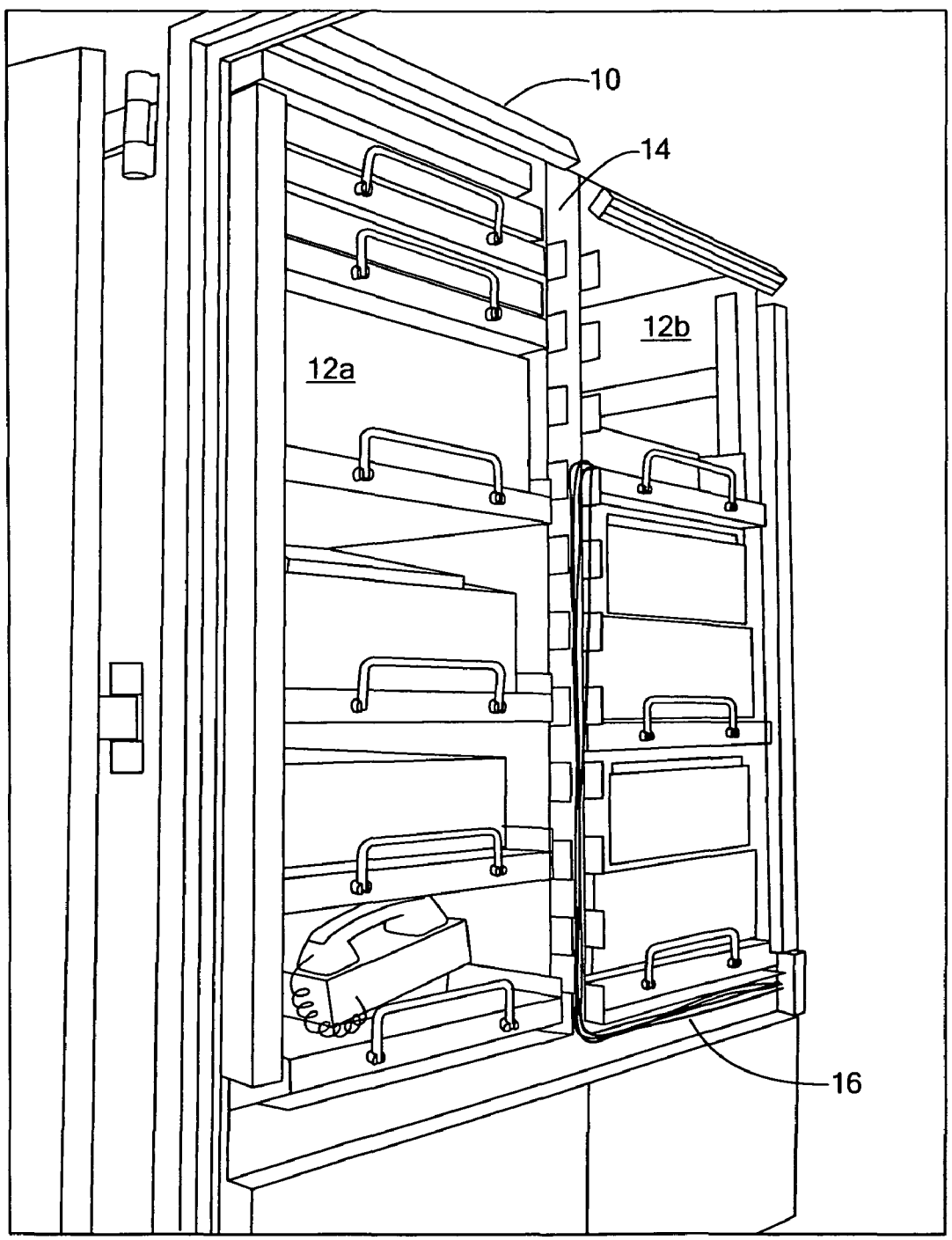
FIG. 1 is a highly schematic front view showing an example of an equipment rack in accordance with the prior art.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Figure 2:
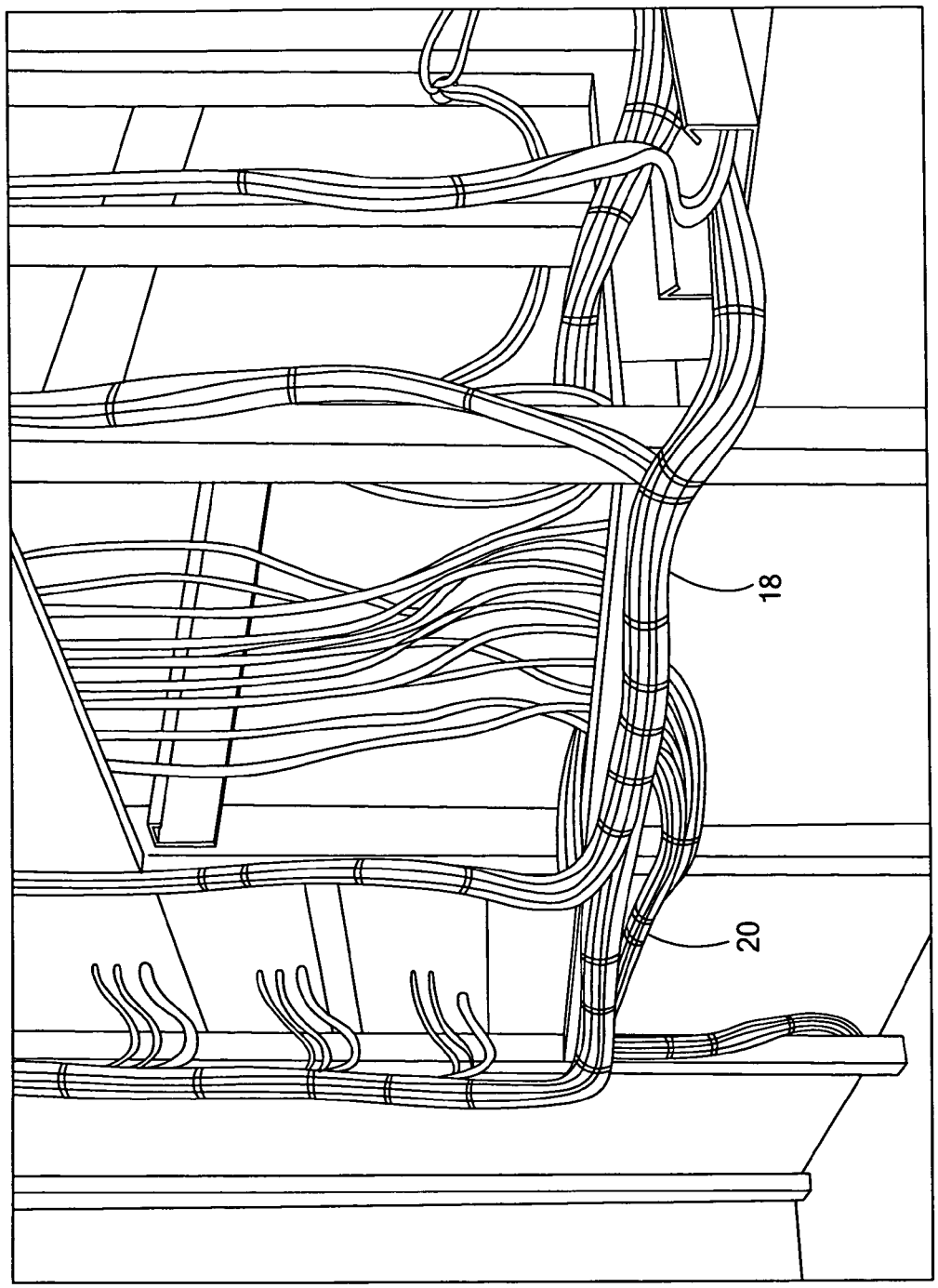
FIG. 2 is a schematic three-dimensional rear view showing the unwieldy cable routing associated with a prior art equipment rack.

FIG. 1 shows an example of a prior equipment rack 10 with bays 12a and 12b and cable raceway 14 between the two bays. Note the unwieldy cabling at 16. Note at the rear of the cabinet, FIG. 2, the unwieldy cabling as shown at 18 and 20.

Figure 3:
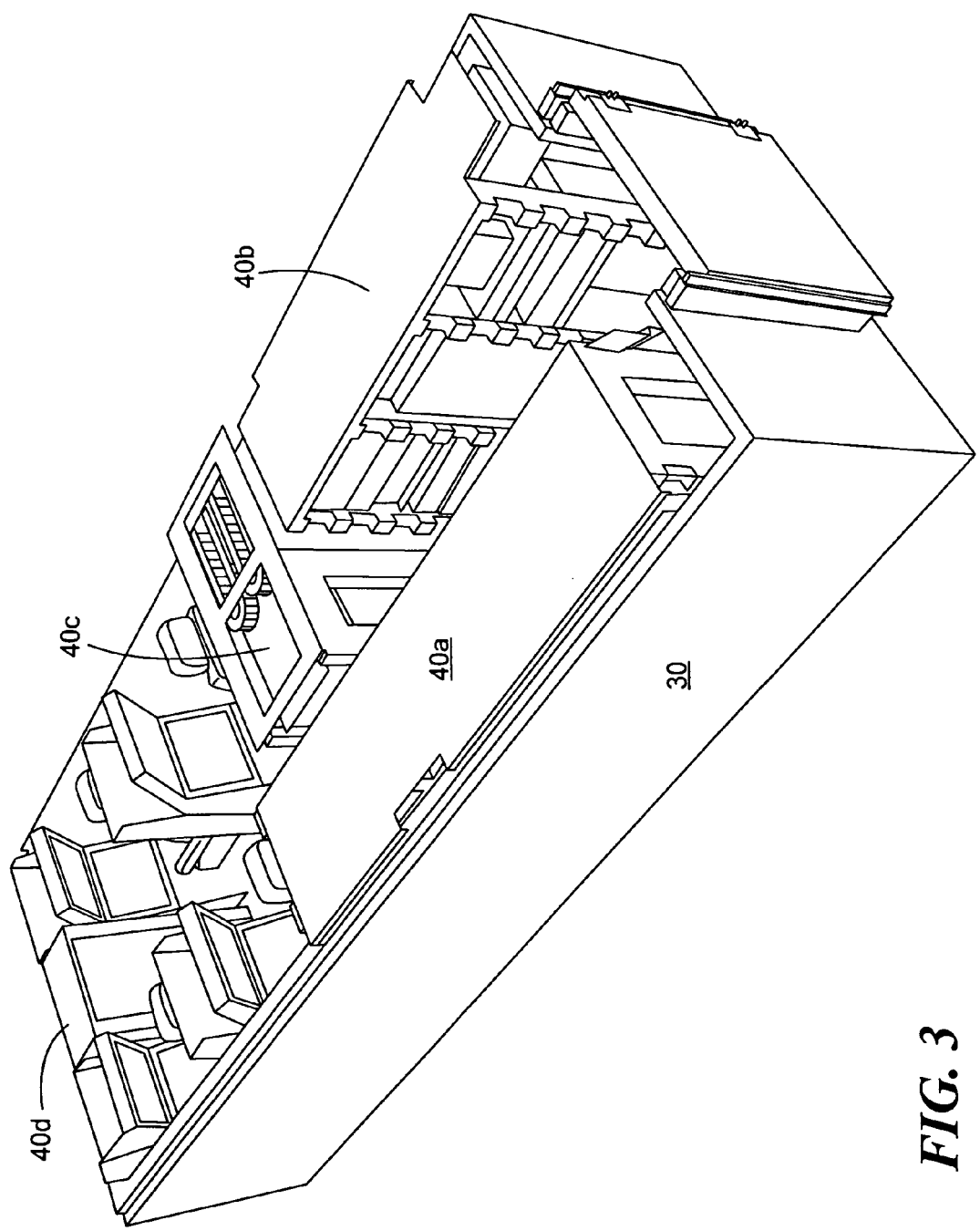
FIG. 3 is a schematic three-dimensional partial view of a height reducible electronics enclosure and the equipment racks of the subject invention mounted therein.

Such existing rack systems are unsuitable for height reducible electronics enclosure 30, FIG. 3. Such a height reducible electronics enclosure is designed to be carried by a vehicle and extends to a height of 85 inches when deployed and collapses to a height of 45 inches for transport. Space within the enclosure is extremely limited and prior equipment racks were found to be wholly unsuitable for incorporation into the electronics enclosure.

Figure 4:
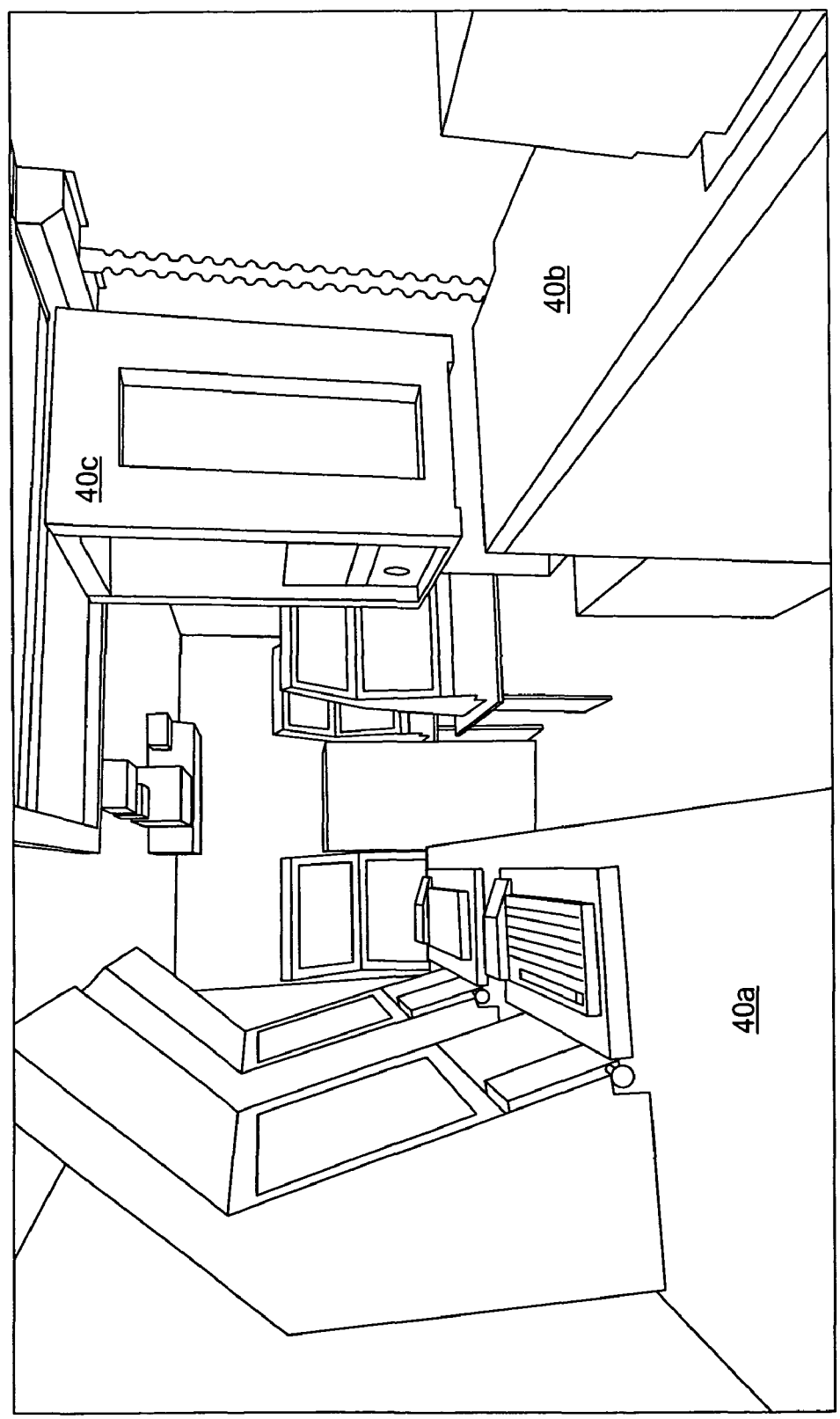
FIG. 4 is a schematic three-dimensional view of the interior of the electronic enclosure of FIG. 3 showing several equipment racks in accordance with the subject invention.
Figure 5:
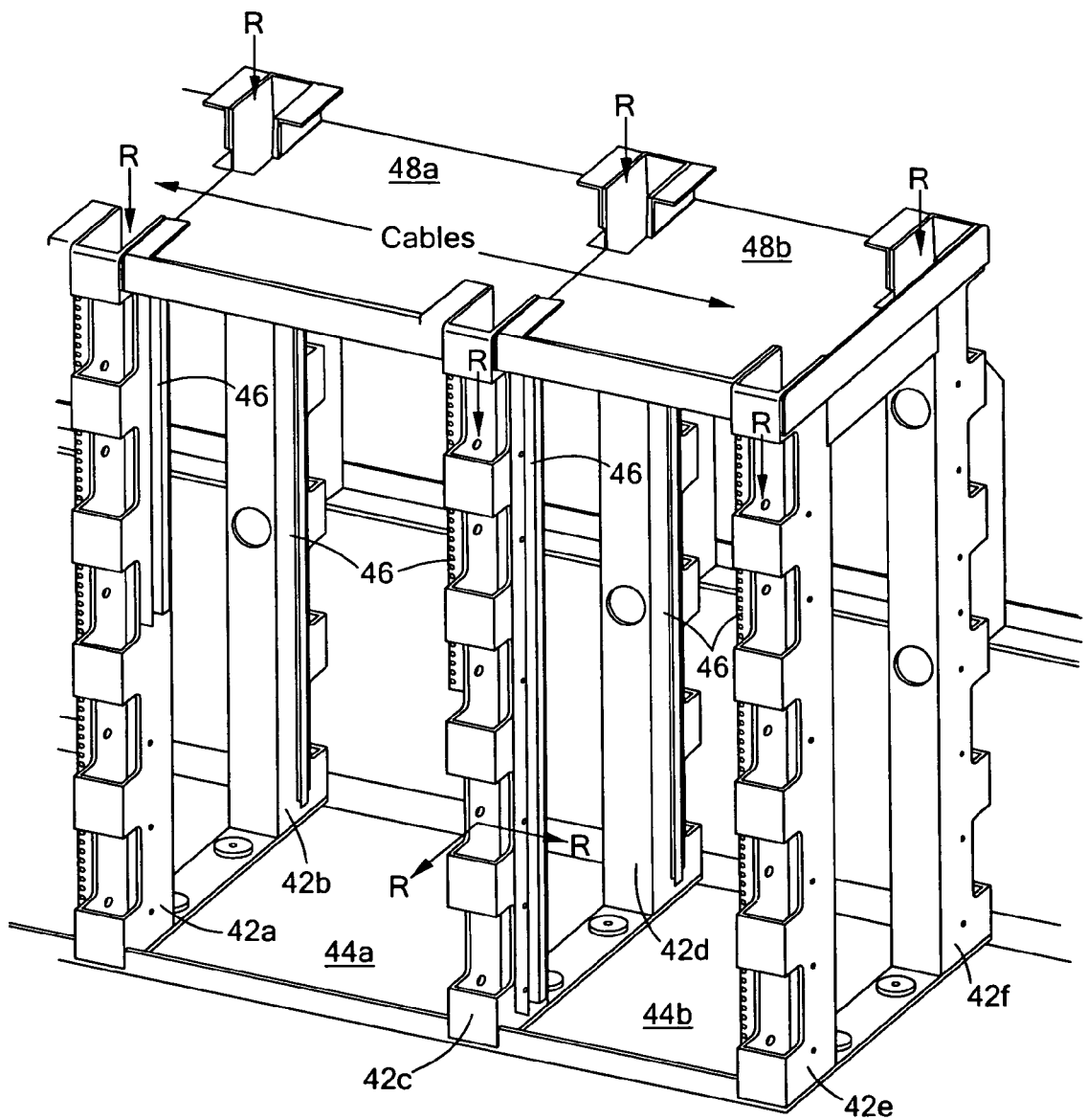
FIG. 5 is a schematic three-dimensional front view showing an example of two bays of an equipment rack in accordance with the subject invention.

In accordance with the subject invention, modular racks 40a, 40b, 40c, and 40d, FIGS. 3-4, in one example in accordance with the subject invention include, as shown in FIG. 5, legs 42a-42d defining bay 44a and legs 42c-42f defining bay 44b. Additional bays are possible in such a modular system as discussed below. Each leg includes an integral cable raceway as shown at R in FIG. 5. An equipment mounting rail 46 is attached to each leg to mount electronic equipment "blades". There is a cable management tray 48a for bay 44a and cable management tray 48b for bay 44b. Or, two cable management trays 48a and 48b could be unitary in construction and cover both bays 44a and 44b.

The result is a modular rack system with increased functionality and increased capacity. The legs of the rack serve as both supporting members defining the bays and as cable raceways and the top of the rack serves as a structural element, as a cable management tray, functions to serve as additional storage space, and serves as a work surface. In accordance with such a design, an 8% increase in usable rack height for a 40-inch tall rack is realized. Prior rack designs had a capacity of 21 U (a U is defined as a vertical measurement of 1.75 inches) whereas a rack of comparable size in accordance with the design of the subject invention had a capacity of 23 U. For a given footprint and rack height, the invention produces the equivalent of one additional bay for a capacity of 2 U for 11 racks. Top cable trays 48a and 48b leverages the open top design of the electronics enclosure.

Figure 6:
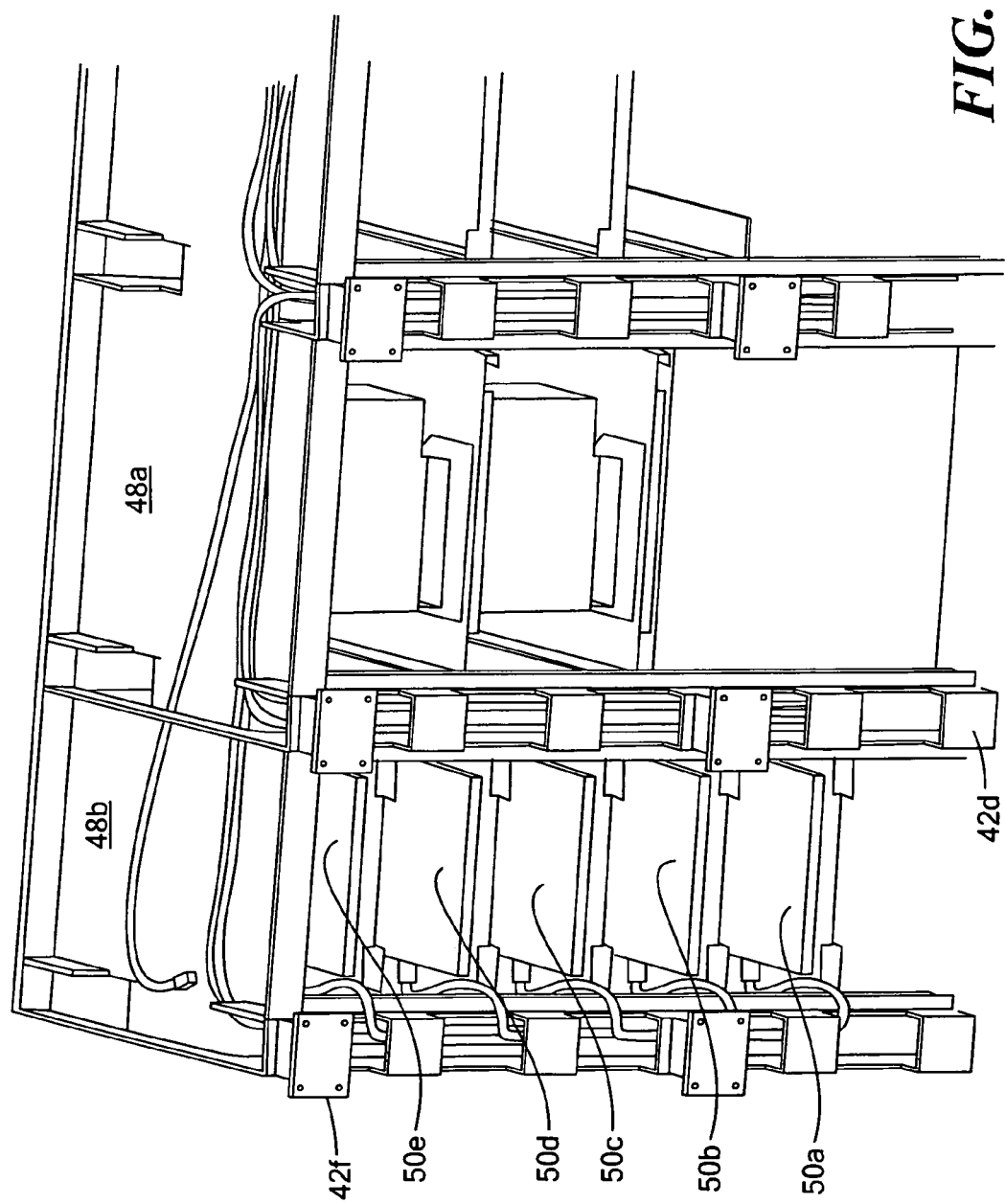
FIG. 6 is a schematic three-dimensional front view again showing a modular rack system in accordance with the subject invention.

FIG. 6 shows equipment blades 50a-50d mounted in one bay and the cabling associated therewith extending along trays 48a and 48b and along the length of legs 42d and 42f. The raceways within the legs are 400% larger than the bolt on type raceway shown at 14 in FIG. 1. The preferred cross-sectional area of the raceway is 3 by 6 inches.

Figure 7:
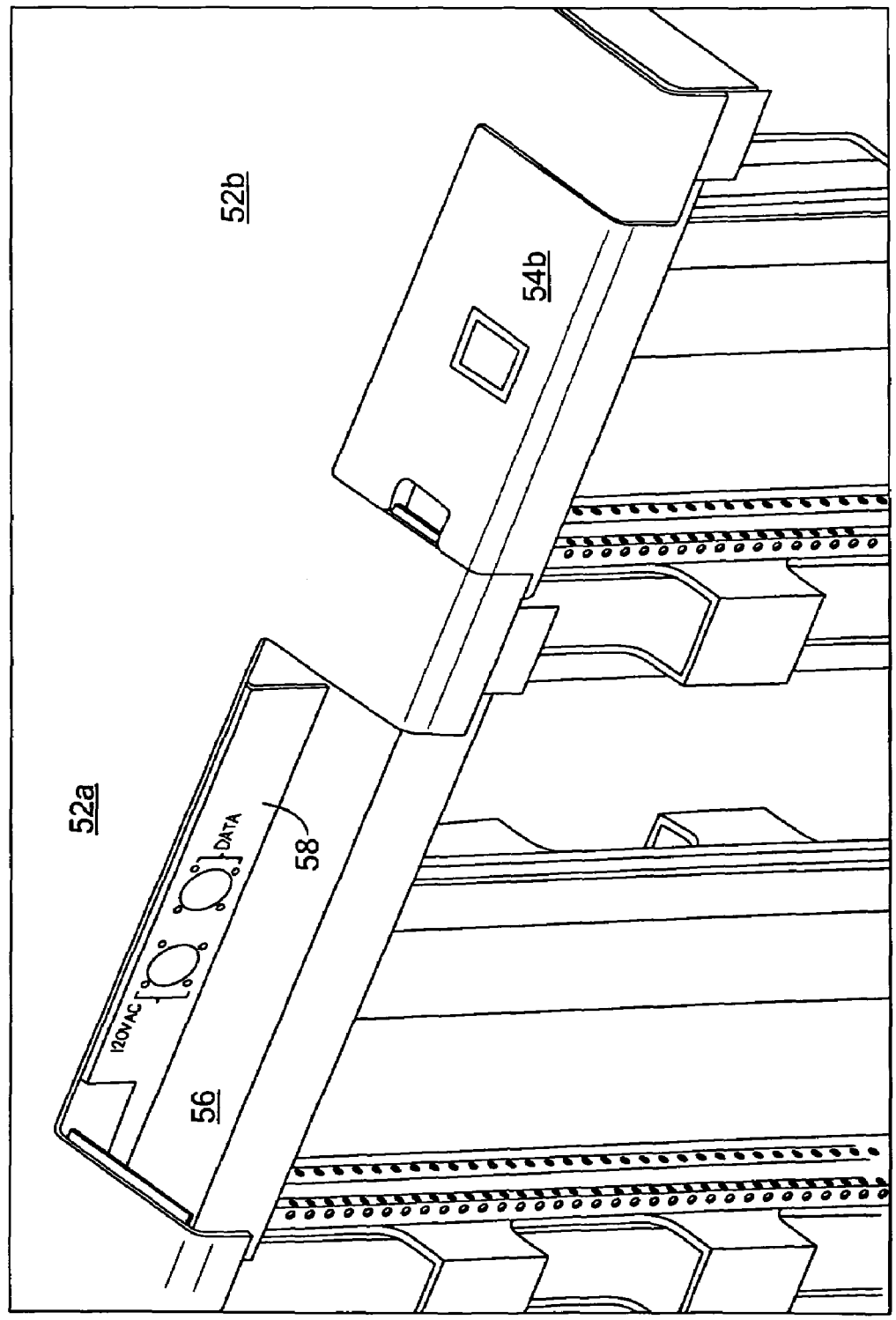
FIG. 7 is a schematic three-dimensional front view showing several details associated with the top cable management tray of the equipment rack of the subject invention.

FIG. 7 shows cable management tray covers 52a and 52b and door 54b in cover 52b (the door of cover 52a has been removed). The doors define storage space 56 in each tray. Bracket 58 maybe included for power and data ports in each storage space. In one preferred design, there is a 19"×5"×2.5" storage space for each bay. Possible uses for the storage place include internet cables, tools, spare parts, a solders' personal items, and the like. Covers 52a and 52b serve as a countertop or work surface.

Figure 8A:
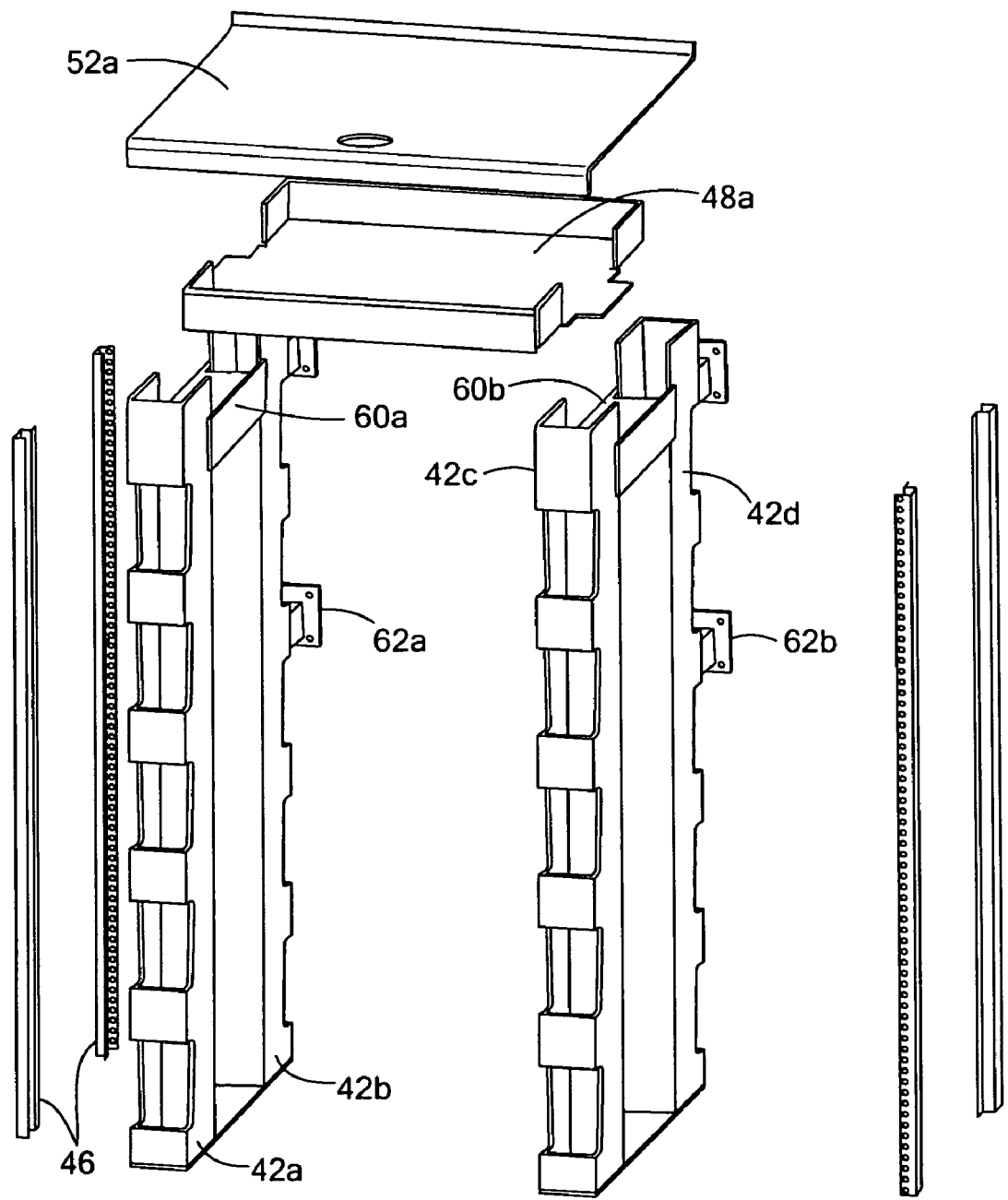
FIG. 8A is a schematic three-dimensional exploded view showing the primary components associated with a single bay of an equipment rack in accordance with the subject invention.
Figure 8B:
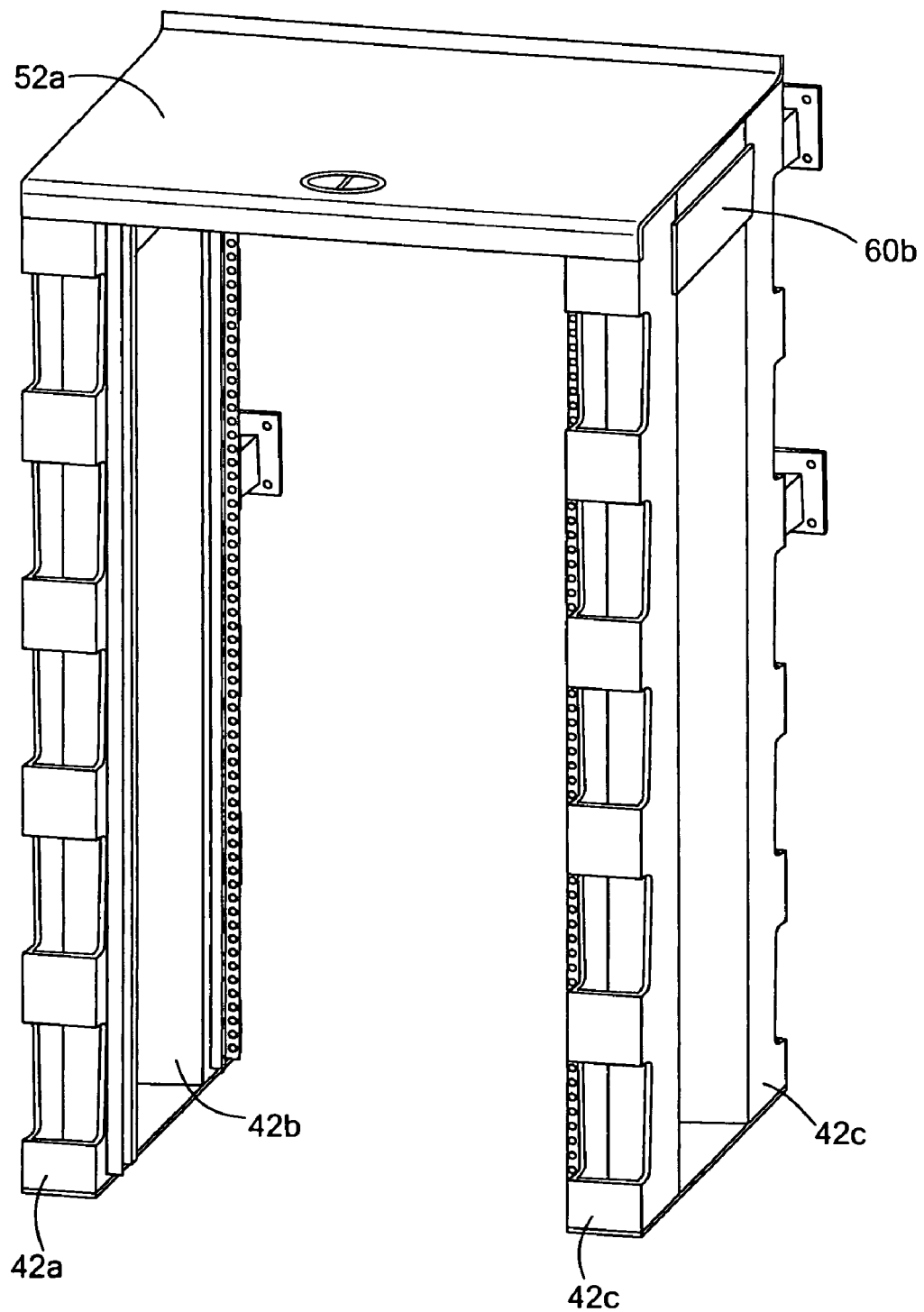
FIG. 8B is a three-dimensional front view of an assembled equipment rack bay.

FIGS. 8A-8B show one modular bay design defined by four legs 42a-42d, equipment mounting rails 46 (one for each leg), cable tray 48 extending across the top of the bay, and cover 52a. Also shown are supporting bracket 60a between legs 42a and 42b and bracket 60b between legs 42c and 42d. Typical materials used in the construction of such a modular system include aluminum for cable tray 48a and cover 52a, aluminum extrusions for the legs 42, and standard commercially available mounting rails 46 typically made of steel. It is also possible to include shock isolation for legs 42.

Brackets 62a and 62b, connected to and extending from legs 42b and 42d, respectively, can be used to secure the rack to a structural elements such as a wall within the enclosure.

Figure 9A:
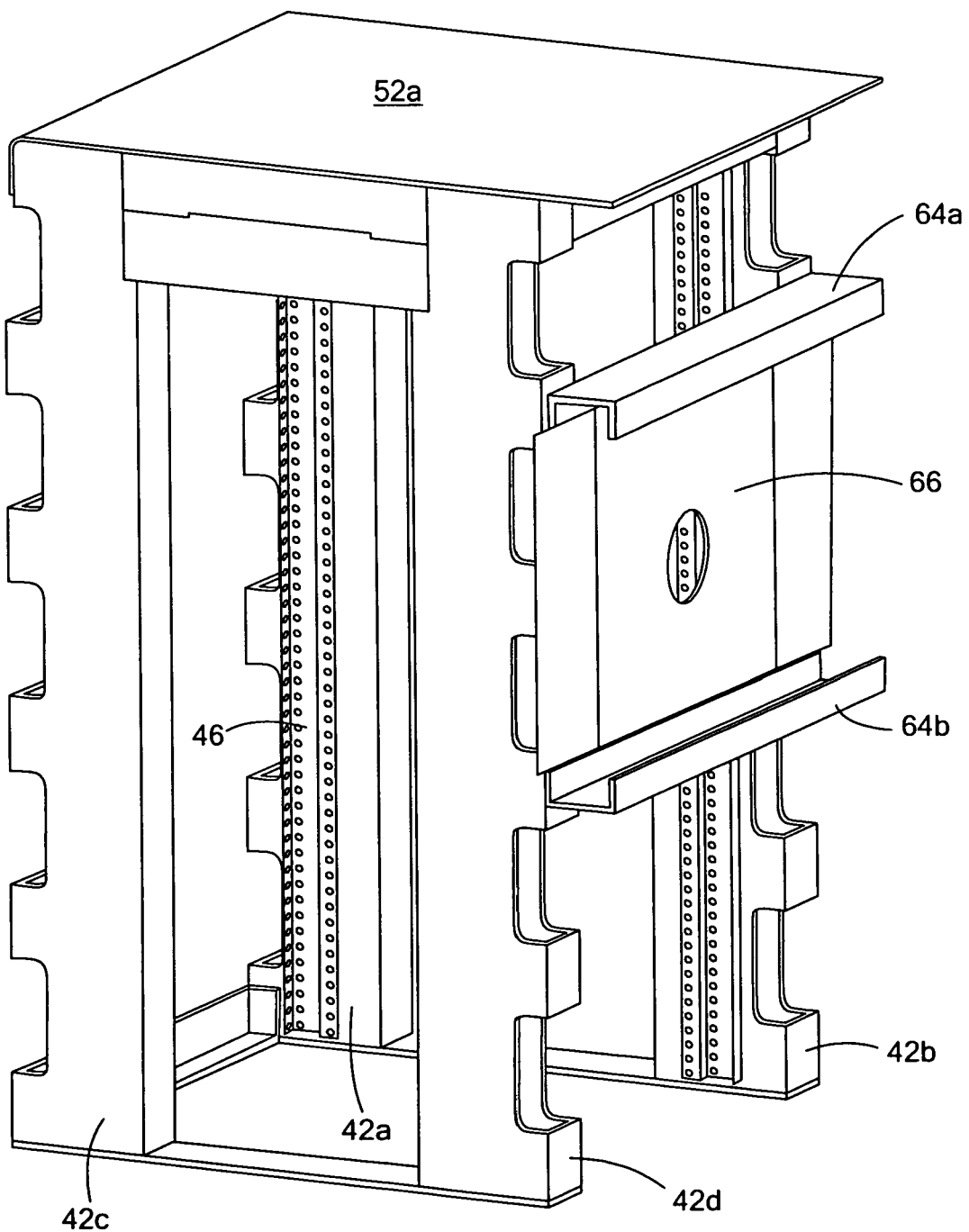
FIG. 9A is a schematic three-dimensional rear view of a single bay equipment rack in accordance with the subject invention.
Figure 9B:
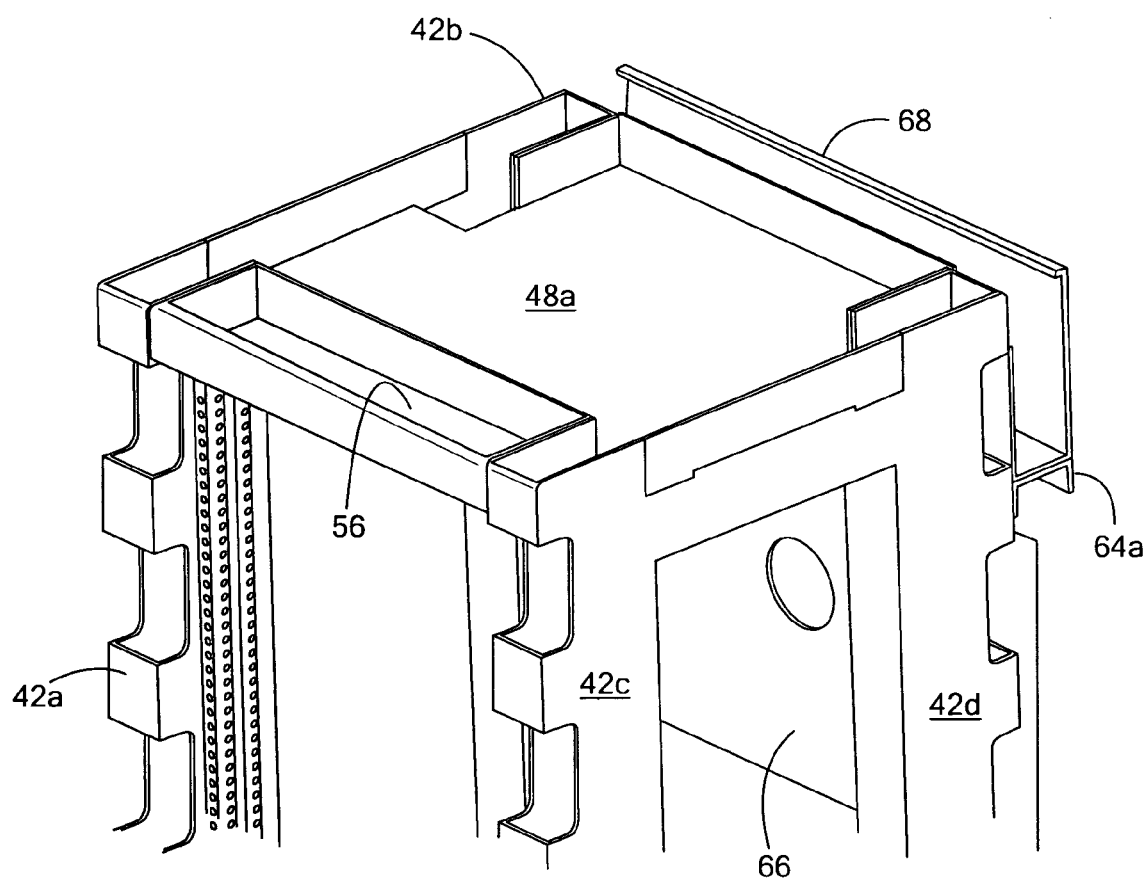
FIG. 9B is a schematic three-dimensional top view showing a single bay and its top cable tray with the cover removed.

FIGS. 9A and 9B show another type of bracket in the form of structural channel 64a and 64b for securing the rear of the rack to a wall and defining an air duct volume therebetween. Removable orifice plate 66 defines an airflow path for each bay. As shown in FIG. 9B, additional cable raceway 68 maybe incorporated in channel 64a.

Figure 10:
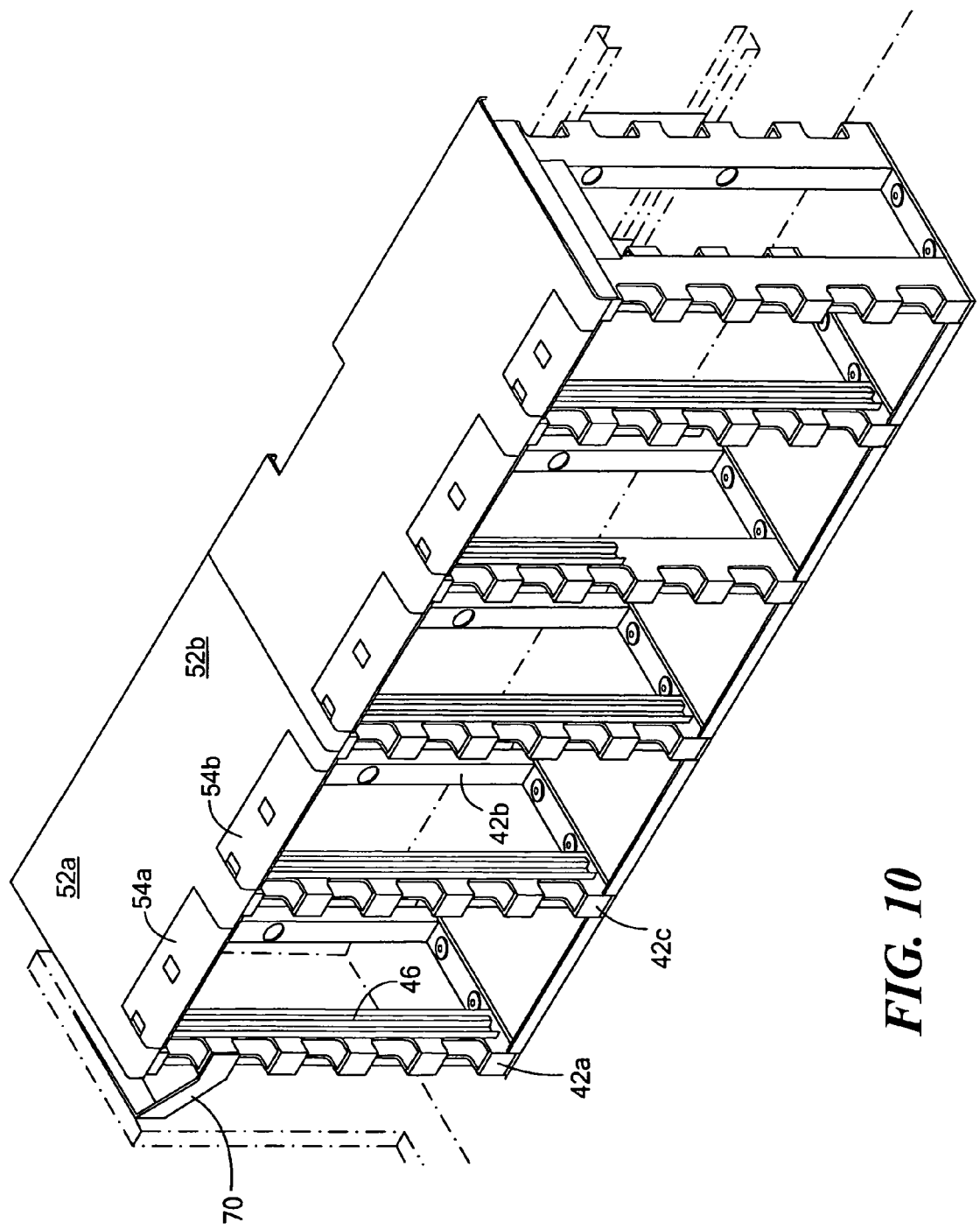
FIG. 10 is a schematic three-dimensional front view showing a five bay equipment rack in accordance with the subject invention.
Figure 11:
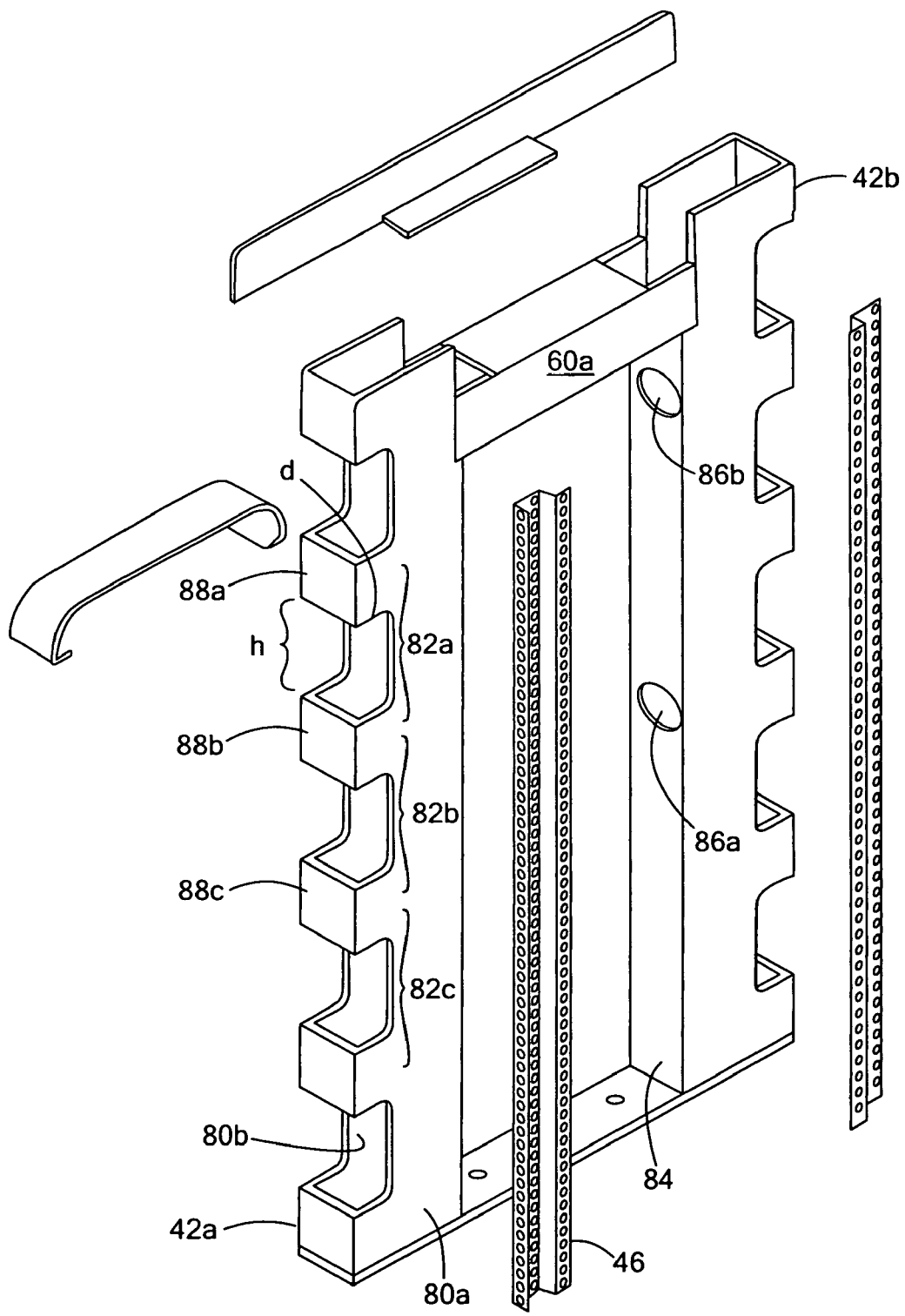
FIG. 11 is a schematic three-dimensional exploded view showing in more detail two legs of an equipment rack in accordance with the subject invention.

FIG. 10 shows a five-bay rack and bracket 70 for securing leg 42a to a wall. Note that legs 42b and 42c serve as legs for two adjacent bays. As shown for leg 42a, FIG. 11, the preferred design includes spaced side walls 80a and 80b each including, as depicted for side wall 80a, outward spaced castellations 82a-82c for access to the cable raceway between the sidewalls. Also included is inward wall 84 as shown for leg 42b with spaced orifices 86a and 86b also for cable access. Integral end caps 88a, 88b, and 88c and the like bridge the castellations between adjacent sidewalls in each leg providing structural support. In one example, each leg was 44.31 inches tall and each castellation opening into the cable trace space between the legs sidewalls had a height h of 5.00 inches and a depth d of 2.00 inches.

The subject invention has been described in particular with respect to a height reducible electronics enclosure but the modular rack system of the subject invention will have other uses and can be configured to have a height and a bay width and depth depending on the specific application. In any embodiment, the modular rack of the subject invention has increased capability due in part to structural elements which make up the rack performing multiple functions. The preferred rack is modular and reconfigurable and provides easy access to cabling and also maximizes the space available for the electronic equipment housed by the rack. The modularity, integrated features, and compact size of the rack of the subject invention is attractive to the commercial rack market. The integrated rack structure of the subject invention in the preferred embodiment leverages the open top opportunity of the height reducible electronics enclosure and eliminates the dead space between bays of a typical rack to produce a rack with more usable equipment mounting height than commercially available racks and, in addition, features an integrated cable management system. Access to the equipment is improved, the modular rack system is easily scalable and meets MIL-STD-810 ground mobile environmental requirements. The rack maybe used in connection with any tactical ground-mobile system where volume and cable management are concerns and the integrated cable raceways, increased stowage capacity, and overall modularity is useful (e.g., in commercial 19" rack applications).

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments. Other embodiments will occur to those skilled in the art and are within the following claims.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

What is claimed is:

1. A modular rack system comprising:
a plurality of legs each including an internal cable raceway and arranged to define electronic equipment bays between spaced legs, each leg including spaced sidewalls each including spaced outward castellations for access to the cable raceway between the spaced sidewalls;
equipment mounting rails for the bays;
a cable management tray extending across the top of each bay;
a plurality of brackets each for fastening one of the legs to a structure; and
a removable orifice plate between adjacent brackets.

2. The modular rack system of claim 1 further including an inward wall joining the spaced sidewalls.

3. The modular rack system of claim 2 in which the inward wall includes spaced orifices for access to the cable raceway between the spaced sidewalls.

4. The modular rack system of claim 1 further including spaced end caps bridging the castellations.

5. The modular rack system of claim 1 further including a bracket between adjacent legs in each bay.

6. The modular rack system of claim 1 further including a cover for each cable management tray.

7. The modular rack system of claim 6 further including a door in each cover defining a storage space in each tray.

8. The modular rack system of claim 7 further including a bracket for power and data ports in each storage space.

9. A modular rack system comprising:
at least one bay defined by four legs;
each leg including an integral cable raceway and an equipment mounting rail, each leg including spaced sidewalls each including spaced outward castellations for access to the cable raceway between the spaced sidewalls;
an inward wall joining the spaced sidewalls; and
a cable management tray extending across the top of the bay.

10. The modular rack system of claim 9 in which the inward wall includes spaced orifices for access to the cable raceway between the spaced sidewalls.

11. The modular rack system of claim 9 further including spaced end caps bridging the castellations.

12. The modular rack system of claim 9 further including a bracket between adjacent legs in each bay.

13. The modular rack system of claim 9 further including a cover for each cable management tray.

14. The modular rack system of claim 13 further including a door in each cover defining a storage space in each tray.

15. The modular rack system of claim 14 further including a bracket for power and data ports in each storage space.

16. The modular rack system of claim 9 further including a plurality of brackets each for fastening one of the legs to a structure.

17. The modular rack system of claim 16 further including a removable orifice plate between adjacent brackets.

18. A modular rack system comprising:
a plurality of legs arranged to define electronic equipment bays between spaced legs, each leg including spaced sidewalls defining a cable raceway, each side wall having spaced outward castellations for access to the cable raceway;
equipment mounting rails for the bays;
a cable management tray extending across the top of each bay, each cover including a door defining a storage space in each tray; and
a cover for said cable management tray.

19. A modular rack system comprising:
a plurality of legs including an integral cable raceway and arranged to define electronic equipment bays between spaced legs, each said leg including spaced sidewalls each including spaced outward castellations for access to the cable raceway between the spaced sidewalls;
equipment mounting rails for the bays;
a cable management tray extending across the top of each bay;
a plurality of brackets each for fastening one of the legs to a structure; and
a removable orifice plate between adjacent brackets.

20. A modular rack system comprising:
a plurality of legs including an integral cable raceway and arranged to define electronic equipment bays between spaced legs;
equipment mounting rails for the bays;
a cable management tray extending across the top of a bay, each cover including a door defining a storage space in each tray; and
a cover for said cable management tray.

21. A modular rack system comprising:
a plurality of legs including an integral cable raceway and arranged to define electronic equipment bays between spaced legs, each leg including spaced sidewalls each including spaced outward castellations for access to the cable raceway between the spaced sidewalls;
equipment mounting rails for the bays;
a cable management tray extending across the top of each bay;

a plurality of brackets each for fastening one of the legs to a structure; and
a removable orifice plate between adjacent brackets.

* * * * *